(12) United States Patent
Toncich et al.

(10) Patent No.: US 7,154,440 B2
(45) Date of Patent: Dec. 26, 2006

(54) PHASE ARRAY ANTENNA USING A CONSTANT-GAIN PHASE SHIFTER

(75) Inventors: Stanley S. Toncich, San Diego, CA (US); Jorge Fabrega-Sanchez, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 59 days.

(21) Appl. No.: 11/060,010

(22) Filed: Feb. 16, 2005

(65) Prior Publication Data

US 2005/0207518 A1 Sep. 22, 2005

Related U.S. Application Data

(63) Continuation-in-part of application No. 10/981,814, filed on Nov. 5, 2004, now Pat. No. 7,116,954, which is a continuation of application No. 10/076,171, filed on Feb. 12, 2002, now Pat. No. 6,816,714, application No. 11/060,010, and a continuation-in-part of application No. 10/120,938, filed on Apr. 10, 2002.

(60) Provisional application No. 60/283,093, filed on Apr. 11, 2001.

(51) Int. Cl.
*H01P 1/18* (2006.01)
(52) U.S. Cl. .................. 342/372; 342/375; 333/139; 333/156
(58) Field of Classification Search .......... 333/138, 333/139, 156, 161, 164; 342/372, 375; 330/302
See application file for complete search history.

(56) References Cited

U.S. PATENT DOCUMENTS

| | | | |
|---|---|---|---|
| 3,239,838 A | 3/1966 | Kelleher | |
| 3,413,543 A | 11/1968 | Schubring et al. | |
| 3,569,795 A | 3/1971 | Gikow | |
| 3,676,803 A | 7/1972 | Simmons | |

(Continued)

FOREIGN PATENT DOCUMENTS

DE 40 36 866 7/1991

(Continued)

OTHER PUBLICATIONS

Chandler, S.R. et al., "Active Varactor Tunable Bandpass Filter," IEEE Microwave and Guided Wave Letters, vol. 3, No. 3, Mar. 1993, pp. 70-71.

(Continued)

*Primary Examiner*—Benny T. Lee (57) ABSTRACT

A constant-gain phase shifter is provided, comprising a first tank circuit with a first node to accept an input signal, a first inductor connected between the first node and a reference voltage, and a first capacitor connected in parallel with the first inductor. The first tank circuit modifies the phase and the insertion loss associated with the input signal. A variable gain circuit has as input connected to the first node, an input to accept a control signal, and an output to supply a gain-modified signal. A second tank circuit comprises a second node connected to the variable insertion loss circuit output to supply a constant-gain phase-shifted signal, a second inductor connected between the second node and the reference voltage, and a second capacitor connected in parallel with the second inductor. The second tank circuit modifies the phase and insertion loss associated with the gain-modified signal.

22 Claims, 6 Drawing Sheets

U.S. PATENT DOCUMENTS

| | | |
|---|---|---|
| 3,678,305 A | 7/1972 | George |
| 3,680,135 A | 7/1972 | Boyer |
| 3,737,814 A | 6/1973 | Pond |
| 3,739,299 A | 6/1973 | Adler |
| 3,836,874 A | 9/1974 | Maeda et al. |
| 3,918,012 A | 11/1975 | Peuzin |
| 4,122,400 A | 10/1978 | Medendorp et al. |
| 4,236,125 A | 11/1980 | Bernard et al. |
| 4,475,108 A | 10/1984 | Moser |
| 4,484,157 A | 11/1984 | Helle et al. |
| 4,494,081 A | 1/1985 | Lea et al. |
| 4,525,720 A | 6/1985 | Corzine et al. |
| 4,604,593 A * | 8/1986 | Yarman ............... 333/139 |
| 4,626,800 A | 12/1986 | Murakami et al. |
| 4,733,328 A | 3/1988 | Blazej |
| 4,736,169 A | 4/1988 | Weaver et al. |
| 4,737,797 A | 4/1988 | Siwiak et al. |
| 4,746,925 A | 5/1988 | Toriyama |
| 4,792,939 A | 12/1988 | Hikita et al. |
| 4,799,066 A | 1/1989 | Deacon |
| 4,835,499 A | 5/1989 | Pickett |
| 4,835,540 A | 5/1989 | Haruyama et al. |
| 4,847,626 A | 7/1989 | Kahler et al. |
| 4,975,604 A | 12/1990 | Barta |
| 5,045,821 A * | 9/1991 | Staudinger et al. ......... 333/118 |
| 5,166,857 A | 11/1992 | Avanic et al. |
| 5,173,709 A | 12/1992 | Lauro et al. |
| 5,212,463 A | 5/1993 | Babbitt et al. |
| 5,216,392 A | 6/1993 | Fraser |
| 5,227,748 A | 7/1993 | Sroka |
| 5,231,407 A | 7/1993 | McGirr et al. |
| 5,281,974 A * | 1/1994 | Kuramoto et al. ... 343/700 MS |
| 5,293,408 A | 3/1994 | Takahashi et al. |
| 5,307,031 A * | 4/1994 | Dick ........................ 333/28 R |
| 5,307,033 A | 4/1994 | Koscica et al. |
| 5,325,099 A | 6/1994 | Nemit et al. |
| 5,388,021 A | 2/1995 | Stahl |
| 5,406,163 A | 4/1995 | Carson et al. |
| 5,416,803 A | 5/1995 | Janer |
| 5,427,988 A | 6/1995 | Sengupta et al. |
| 5,450,092 A | 9/1995 | Das |
| 5,451,915 A | 9/1995 | Katzin et al. |
| 5,459,123 A | 10/1995 | Das |
| 5,472,935 A | 12/1995 | Yandrofski et al. |
| 5,479,139 A | 12/1995 | Koscica et al. |
| 5,495,215 A | 2/1996 | Newell et al. |
| 5,496,795 A | 3/1996 | Das |
| 5,496,796 A | 3/1996 | Das |
| 5,502,422 A | 3/1996 | Newell et al. |
| 5,525,942 A | 6/1996 | Horii et al. |
| 5,557,286 A | 9/1996 | Varadan et al. |
| 5,561,307 A | 10/1996 | Mihara et al. |
| 5,561,407 A | 10/1996 | Koscica et al. |
| 5,564,086 A | 10/1996 | Cygan et al. |
| 5,574,410 A | 11/1996 | Collins et al. |
| 5,577,025 A | 11/1996 | Skinner |
| 5,583,524 A | 12/1996 | Milroy |
| 5,589,845 A | 12/1996 | Yandrofski |
| 5,600,279 A | 2/1997 | Mori |
| 5,617,104 A | 4/1997 | Das |
| 5,640,042 A | 6/1997 | Koscica et al. |
| 5,649,306 A | 7/1997 | Vanatta et al. |
| 5,652,599 A | 7/1997 | Wallace et al. |
| 5,673,188 A | 9/1997 | Lusher et al. |
| 5,701,595 A | 12/1997 | Green, Jr. |
| 5,721,194 A | 2/1998 | Yandrofski et al. |
| 5,729,239 A | 3/1998 | Rao |
| 5,777,524 A | 7/1998 | Wojewoda et al. |
| 5,777,839 A | 7/1998 | Sameshina et al. |
| 5,778,308 A | 7/1998 | Sroka et al. |
| 5,830,591 A | 11/1998 | Sengupta et al. |
| 5,834,975 A | 11/1998 | Bartlett et al. |
| 5,864,932 A | 2/1999 | Evans et al. |
| 5,870,670 A | 2/1999 | Ripley |
| 5,880,921 A | 3/1999 | Tham et al. |
| 5,892,486 A | 4/1999 | Cook et al. |
| 5,908,811 A | 6/1999 | Das |
| 5,910,994 A | 6/1999 | Lane et al. |
| 5,945,887 A | 8/1999 | Makino et al. |
| 5,965,494 A | 10/1999 | Terashima et al. |
| 5,973,567 A | 10/1999 | Heal et al. |
| 5,973,568 A | 10/1999 | Shapiro et al. |
| 5,986,515 A | 11/1999 | Sakurai |
| 5,987,314 A | 11/1999 | Salto |
| 5,990,766 A | 11/1999 | Zhan |
| 6,008,659 A | 12/1999 | Traynor |
| 6,018,282 A | 1/2000 | Tsuda |
| 6,020,787 A | 2/2000 | Kim et al. |
| 6,026,311 A | 2/2000 | Willemsen Cortes et al. |
| 6,028,561 A | 2/2000 | Takei |
| 6,049,726 A | 4/2000 | Gruenwald et al. |
| 6,052,036 A | 4/2000 | Enstrom et al. |
| 6,054,908 A | 4/2000 | Jackson |
| 6,094,588 A | 7/2000 | Adam |
| 6,097,263 A | 8/2000 | Mueller et al. |
| 6,101,102 A | 8/2000 | Brand et al. |
| 6,108,191 A | 8/2000 | Bruchhaus et al. |
| 6,160,524 A | 12/2000 | Wilber |
| 6,181,777 B1 | 1/2001 | Kiko |
| 6,198,441 B1 | 3/2001 | Okabe |
| 6,216,020 B1 | 4/2001 | Findikoglu |
| 6,242,843 B1 | 6/2001 | Pohjonen et al. |
| 6,272,336 B1 | 8/2001 | Appel et al. |
| 6,278,383 B1 | 8/2001 | Endo et al. |
| 6,281,023 B1 | 8/2001 | Eastep et al. |
| 6,281,534 B1 | 8/2001 | Arita et al. |
| 6,285,337 B1 | 9/2001 | West et al. |
| 6,292,143 B1 | 9/2001 | Romanofsky |
| 6,294,964 B1 | 9/2001 | Satoh |
| 6,308,051 B1 | 10/2001 | Atokawa |
| 6,327,463 B1 | 12/2001 | Welland |
| 6,329,959 B1 | 12/2001 | Varadan et al. |
| 6,333,719 B1 | 12/2001 | Varadan |
| 6,335,710 B1 | 1/2002 | Falk et al. |
| 6,344,823 B1 | 2/2002 | Deng |
| 6,359,444 B1 | 3/2002 | Grimes |
| 6,362,784 B1 | 3/2002 | Kane et al. |
| 6,362,789 B1 | 3/2002 | Trumbull et al. |
| 6,384,785 B1 | 5/2002 | Kamogawa et al. |
| 6,404,304 B1 | 6/2002 | Kwon et al. |
| 6,456,236 B1 | 9/2002 | Hauck et al. |
| 6,462,628 B1 | 10/2002 | Kondo et al. |
| 6,489,860 B1 | 12/2002 | Ohashi |
| 6,503,786 B1 | 1/2003 | Klodzinski |
| 6,518,850 B1 | 2/2003 | Falk et al. |
| 6,518,920 B1 | 2/2003 | Proctor, Jr. et al. |
| 6,522,220 B1 | 2/2003 | Yamada et al. |
| 6,525,630 B1 | 2/2003 | Zhu et al. |
| 6,525,691 B1 | 2/2003 | Varadan et al. |
| 6,531,936 B1 | 3/2003 | Chiu et al. |
| 6,559,737 B1 | 5/2003 | Nagra et al. |
| 6,571,110 B1 | 5/2003 | Patton et al. |
| 6,600,456 B1 | 7/2003 | Gothard et al. |
| 6,653,977 B1 | 11/2003 | Okabe et al. |
| 6,667,723 B1 | 12/2003 | Forrester |
| 6,686,817 B1 | 2/2004 | Zhu et al. |
| 6,721,293 B1 | 4/2004 | Komulainen et al. |
| 6,727,535 B1 | 4/2004 | Sengupta et al. |
| 6,819,203 B1 | 11/2004 | Taniguchi |
| 6,842,086 B1 | 1/2005 | Zennamo, Jr. |
| 2001/0026243 A1 | 10/2001 | Koitsalu et al. |
| 2001/0043159 A1 | 11/2001 | Masuda et al. |
| 2002/0049064 A1 | 4/2002 | Banno |
| 2002/0093400 A1 | 7/2002 | Zhu et al. |

| | | | |
|---|---|---|---|
| 2002/0149526 A1 | 10/2002 | Tran et al. | |
| 2002/0149535 A1 | 10/2002 | Toncich | |
| 2002/0175878 A1 | 11/2002 | Toncich | |
| 2003/0062971 A1 | 4/2003 | Toncich | |
| 2003/0134665 A1 | 7/2003 | Kato et al. | |
| 2004/0087280 A1 | 5/2004 | Watanabe et al. | |
| 2004/0162047 A1 | 8/2004 | Kasahara et al. | |
| 2004/0196121 A1 | 10/2004 | Toncich | |
| 2004/0212457 A1 | 10/2004 | Eden et al. | |
| 2004/0263411 A1 | 12/2004 | Fabrega-Sanchez et al. | |
| 2005/0007291 A1 | 1/2005 | Fabrega-Sanchez et al. | |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 | 2/1995 |
| EP | 0 680 108 | 11/1995 |
| EP | 0 795 922 | 9/1997 |
| EP | 0 854 567 | 7/1998 |
| EP | 0 872 953 | 10/1998 |
| EP | 0 881 700 | 12/1998 |
| EP | 0 892 459 | 1/1999 |
| EP | 0 909 024 | 4/1999 |
| EP | 1 043 741 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 2001 338839 | 12/2001 |
| WO | WO 82/03510 | 10/1982 |
| WO | WO 94/27376 | 11/1994 |
| WO | WO 00/35042 | 6/2000 |
| WO | WO 00/62367 | 10/2000 |
| WO | WO 03/058759 | 7/2001 |
| WO | WO 02/084798 | 10/2002 |

OTHER PUBLICATIONS

Chang, C. et al., "Microwave Active Filters Based on Coupled Negative Resistance Method," IEEE Trans. on Microwave Theory & Techs., vol. 38, No. 12, Dec. 1990, pp. 1879-1884.
Cohn, S.B., "Dissipation Loss in Multiple-Coupled-Resonator Filters," Proc. IRE 47, Aug. 1959, pp. 1342-1348.
Cuthbert, T., "Broadband Impedance Matching -Fast and Simple", RF Design, Cardiff Publishing Co., vol. 17, No. 12, Nov. 1994, pp. 38, 42, 44, 48, XP000477834.
Dishal, M., "Alignment and Adjustment of Synchronously Tuned Multiple Resonator-Circuit Filters," Proc. IRE 39, Nov. 1951, pp. 1448-1455.
Erker et al., "Monolithic Ka-Band Phase Shifter Using Voltage Tunable BaSrTiO3 Parallel Plate Capacitors", IEEE Microwave and Guided Wave Letters, IEEE Inc., vol. 10, No. 1, Jan. 2000, pp. 10-12 XP-000930368.
Fubini, E.G. et al., "Minimum Insertion Loss Filters," Proc. IRE 47, Jan. 1959, pp. 37-41.
Fujita, K. et al., "A 15.6 GHz Commercially Based 1/8 GaAs Dynnamic Presealer," 1989 IEEE GaAs IC Symposium, pp. 113-116.
Galt, D. et al., "Ferroelectric Thin Film Characterization Using Superconducting Microstrip Resonators", IEEE Trans on Appl Superconductivity Jun. 1995 IEEE, pp. 2575-2578, vol. 5, No. 2, Piscataway, NJ, USA.
Getsinger, W.J., "Prototypes for Use in Broadbanding Reflection Amplifiers," IEEE Trans. PTGMTT-11, Nov. 1963, pp. 486-497.
Getsinger, W.J. et al., "Some Aspects of the Design of Wide-Band Up-Converters and Nondegenerate Parametric Amplifiers," IEEE Trans. PTGMTT-12, Jan. 1964, pp. 77-87.

Gevorgian, Spartak S. et al., "HTS/Ferroelectric Devices for Microwave Applications", IEEE Transactions on Applied Superconductivity, Jun. 1997, pp. 2458-2461, IEEE, USA.
Hopf, B. et al., "Coplanar MMIC Active Bandpass Filters Using Negative Resistance Circuits," 1994 IEEE MTT-S Symposium Digest, pp. 1183-1185.
Hunter, I.C. et al., "Electronically Tunable Microwave Bandpass Filters," IEEE Trans. on MTT, vol. 30, No. 9, Sep. 1982, pp. 1354-1367.
Jose et al., "Experimental investigations on electronically tunable microstrip antennas," Feb. 5, 1999, Microwave and optical technology letters, vol. 20, No. 3, pp. 166-169.
Kapilevich, B., "Understand the Operation of Channelized Active Filters," Microwaves & RF, Jan. 1997, pp. 89-92.
Kapilevich, B., "Variety of Approaches to Designing Microwave Active Filters," Proc. 27th European Microwave Conference, Jerusalem, vol. 1, 1997, pp. 397-408.
Karacaoglu, U. et al., "High Selectivity Varactor-Tuned MMIC Bandpass Filter Using Lossless Active Resonators," 1994 IEEE MTT-Symposium Digest, pp. 1191-1194.
Katzin, P. et al., "Narrow-band MMIC Filters with Automatic Tuning and Q-Factor Control," 1993 IEEE MTT-S Int. Microwave Symposium Digest, pp. 403-406.
Keis, V. N. et al., "20GHz tunable filter based on ferroelectric (BaSr)TiO3 film varactors", Electronics Letters, May 28, 1998, vol. 34, No. 11, IEE Stevenage, GB.
Kotzebue, K.L., "Broadband Electronically-Tunable Microwave Filters," 1960 IRE Wescon Convention Record, Part 1, pp. 21-27.
Kozyrev, A., et al., "Ferroelectric Films: Nonlinear Properties and Applications in Microwave Devices", 1998 IEEE MTT-S Digest, May 1998, pp. 985-988, 1998 IEEE MTT-S Intl Baltimore, MD, USA, IEEE, USA.
Krautkramer, V.W. et al., "Resonanztransformatoren mit drei Reaktanzen als transformierende Filter", Bulletin des Schweizerischen Elektrotechnischen Vereins, Zurich, CH, vol. 64, No. 23, Nov. 10, 1973, pp. 1500-1509, XP002184530.
Kuh, E.S. et al., "Optimum Synthesis of Wide-Band Parametric Amplifiers and Converters," IRE Trans. PCCT-8, Dec. 1961, pp. 410-415.
Louhos, J.P. et al., "Electrical Tuning of Integrated Mobile Phone Antennas," Nokia Mobile Phones, pp. 69-97 (Sep. 15, 1999).
Makioka, S. et al., "A High Efficiency GaAs MCM Power Amplifier for 1.9 GHz Digital Cordless Telephones," IEEE 1994 Microwave & Millimeter-Wave Monolithic Cir. Sym., pp. 51-54.
Matthaei, G.L., "An Electronically Tunable Up-Converter," Proc. IRE 49, Nov. 1961, pp. 1703-1704.
Nauta, B., "A CMOS Transconductance-C Filter Technique for Very High Frequencies," IEEE Journal of Solid-State Circuits, vol. 27, No. 2, Feb. 1992, pp. 142-153.
Panayi, P.K. et al., "Tuning Techniques for the Planar Inverted-F Antenna," National Conference on Antennas and Propagation Publication, No. 461, pp. 259-262, (Apr. 1999).
Presser, A., "Varactor-Tunable, High-Q Microwave Filter," RCA Review, vol. 42, Dec. 1981, pp. 691-705.
Sleven, R.L., "Design of a Tunable Multi-Cavity Waveguide Band-Pass Filter," 1959 IRE National Convention Record, Part 3, pp. 91-112.
Smuk, J. et al., "MMIC Phase Locked L-S Band Oscillators," 1994 IEEE GaAs Symposium Digest, pp. 27-29.
Taub, J.J. et al., "Design of Three-Resonator Dissipative Band-Pass Filters Having Minimum Insertion Loss," Proc. IRE 45, pp. 681-687 (May 1957).
Toncich et al., "Data Reduction Method for Q Measurements of Stripline Resonators", IEEE Transactions in MTT, vol. 40, No. 9, Sep. 1992, pp. 1833-1836.
Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.
Varadan, V.K. et al., "Design and Development of Electronically Tunable Microstrip Antennas," IOP Publishing Ltd., pp. 238-242, (1999).
Vendik, O.G. et al., "1GHz tunable resonator on bulk single crystal SrTiO3 plated with Yba2Cu307-x films", Electronics Letters, Apr. 13, 1995, pp. 654-656, vol. 31, No. 8, IEE Stevenage, GB.

* cited by examiner

PHASE ARRAY ANTENNA USING A CONSTANT-GAIN PHASE SHIFTER

RELATED APPLICATIONS

This application is a continuation-in-part of U.S. application Ser. No. 10/981,814, filed Nov. 5, 2004 now U.S. Pat. No. 7,116,954, which is a continuation of U.S. application Ser. No. 10/076,171, filed Feb. 12, 2002, now U.S. Pat. No. 6,816,714, which claims the benefit of U.S. Provisional Application Ser. No. 60/283,093, filed Apr. 11, 2001, the disclosures of which are hereby incorporated by reference. This application is a further continuation-in-part of U.S. application Ser. No. 10/120,938 filed Apr. 10, 2002, the disclosure of which is hereby incorporated by reference.

FIELD OF THE INVENTION

This invention generally relates to radio frequency (RF) circuitry and, more particularly, to a wireless communications circuit capable of shifting the phase of a signal, while maintaining a constant signal gain.

BACKGROUND OF THE INVENTION

Phase-shifting circuits are used in many electronic applications, such as in oscillator, phase-locked loops, and filters. RF and microwave frequency phase shift circuits are also useful as components in antenna array systems. The utility of phase-shifting circuits will be illustrated below, using the antenna array as an example.

As noted in U.S. Pat. No. 4,105,959, invented by V. Stachejko, a microwave phase shifter is a device that is capable of changing its electrical length, or phase, in a predictable manner in response to a proper command signal. In a phased array radar system, the electrical length of transmission lines interconnecting parts of the system is critical. For purposes of regulating the phase of transmitted or received signals, the electrical length of transmission lines between a transceiver and the several radiating elements in the antenna array must be made to vary. A typical system requires, for example, several antennae and phase shifters.

Microwave phase shifters were conventional fabricated using either diodes or ferrites as the switched material, using coaxial, stripline, microstrip, or waveguide construction. Several types of diode phase shifters have been devised such as switched line, hybrid coupled, loaded line, and three element "π," or "T" circuits. In particular, the hybrid coupled circuit includes a 3-decibel (db)-quadrature hybrid with a pair of balanced diode switches connected to identical split arms of the hybrid. The hybrid coupler has been used extensively because it achieves larger phase shifts while using only two diodes.

One of the undesirable characteristics of the hybrid coupled diode phase shifter is the unbalance in the insertion loss, as the diodes are switched between the phase states. This unbalance results from the difference in loss produced by the diodes in the conducting state ("on") and the non-conducting state ("off"). The insertion loss is a measure of the change in power (amplitude) between the RF input and output of the phase shifter. It is desirable that the amplitude of the outputs be the same as that of the input and, thus, the difference in insertion loss between the diode switching states be zero. A phase shifter having substantially equal insertion loss between the phase shifter states is desirable for wide frequency band operation. Accurate steering of an antenna beam in a radar system, for example, requires that the phase and amplitude errors be kept small.

Phase shifters made from inductor-capacitor (LC) components suffer from similar problems. As in an LC filter, minimum insertion loss is obtained at the resonant frequency. Changes in phase can be obtained by shifting the resonance away from signal frequency. However, a shift in the signal phase necessarily is accompanied with a change in the signal insertion loss. Thus, LC circuits are prone to the same problems as the above-mentioned diode phase shifters.

With the advent of digital technology, analog-to-digital (A/D) processing techniques have been applied to solve problems associated with the use of the above-mentioned passive and diode components. As noted in U.S. Pat. No. 6,784,831, Wang et al., the signals received from a number of antenna elements can be supplied to signal processing channels, which provide a variable gain and variable phase shift to such signals. An antenna pattern for the combined receive signal can be formed by a set of specific gain values and phase shift values over the signal processing channels, and a specific geometry and placement of the N antenna elements. The set of specific gain values and phase shift values is commonly referred to as "weights" (or "weight vector") for the phased array antenna system. A unique advantage of the phased array antenna system is that the antenna pattern can be adjusted by changing the "weights" to perform one or both of the following operations:

a) beam steering: steering the beam by adjusting the phase shift values of the pattern for each processing channel; no adjustment to the gain values of the pattern is necessary; or b) antenna null: the phase shift values and gain values of the pattern are adjusted to the suppress signal (i.e., interference) from a specific direction.

One form of architecture utilizes a large number of analog-to-digital converters (e.g., one for each antenna element), which substantially increases the cost of the system. Another drawback is that the input signal level of the analog-to-digital converter needs to be at a substantially higher level as compared to that of the received signal at the antenna element. Thus, the received signal needs to be amplified by one or more stages of amplifiers in order to bring the received signal to a level that the analog-to-digital converter can operate properly. Such multistage amplification increases the cost of the system. Yet another drawback of this architecture is that is difficult to maintain the signal delays precisely through the channels because the number of processing elements between the antenna element and the analog-to-digital converter is high. Such precise signal delays are required for accurate beam steering and nulling operations. Thus, calibration of these signal delays is required, which limits the suitability of this prior art phased array antenna system in many wireless communication applications. Another problem, at least with portable handsets, is that there may not necessarily be enough space to house, or power to operate all these components.

Many wireless communication receivers suffer from multipath errors, which are caused by the receiver receiving a composite of the direct signals, and reflected signals from nearby objects such as the ground or nearby buildings. The occurrence of such multipath errors is common within cities with high-rise buildings. A typical antenna can receive-both direct line of sight (LOS) signals and multipath signals. The direct line of sight (LOS) signal and the multipath signal are summed according to their relative phase and strength, resulting in a composite signal having a timing epoch that is different from that of the direct line of sight (LOS) signals. The receiver may be incapable of distinguishing and "rejecting" the reflected signal from the direct line of sight (LOS) signal unless the signal propagation delays of the two signals differ substantially. Beam steering operations can potentially provide antenna gain to reinforce direct signals and nulling operations are used to minimize the effect of received multipath signals. The drawbacks of the architecture of this phased array antenna system as described above also limit its suitability in addressing multipath rejection. More specifically, precise signal delays are required for accurate beam steering/nulling operations that are required for effective multipath rejection. Thus, calibration of these signal delays is required, which limits the suitability of this prior art phased array antenna system in many applications where the user is not realistically expected to maintain and calibrate the equipment.

It would be advantageous if a relatively simple phase-shifter circuit could be devised that could provide a uniform gain at every signal frequency.

SUMMARY OF THE INVENTION

A parallel LC network creates a tuned tank circuit whose resonant frequency is determined by the expression: $f_0=1/(2\pi(L*C)^{1/2})$.

The frequency response of such a circuit is well known. The tank circuit's minimum insertion loss (IL) occurs at $f_0$. The IL is a function of the intrinsic losses of both the inductor and capacitor. Another defining characteristic of the circuit is its phase response. The phase of a signal varies between +45 degrees and −45 degrees between the 3 dB points, where the IL is 3 dB less than the minimum IL. Thus, a filter tuned between its upper and lower 3 dB points changes the phase of a signal by 90 degrees (+45 to −45 degrees). Cascading two tank circuits together can create a phase differential as large as 180 degrees. The two tanks circuits can be isolated through a variable gain amplifier. The gain of the amplifier can be varied to compensate for the ILs associated with each tank circuit. Therefore, a flat amplitude response can be obtained over the entire 180-degree phase shift range. A phase splitter at the output of the circuit can be used to selectively provide an additional 180-degree phase shift, as well as additional buffering. The end result is that the circuit provides a flat amplitude response, while shifting the signal phase anywhere within the range of 0 to 360 degrees.

In one aspect, ferroelectric (FE) capacitors are used as tuning elements in the tank circuits. The FE capacitors are used to both coarsely adjust the center frequency ($f_0$) of the tank circuits, and finely adjust the circuits to obtain the desired phase shift. Using lumped components, the tank circuits can be used for signals in the range between audio and L-band. Using microstrip or stripline inductors, the frequency range may extend well beyond 1 gigahertz (GHz).

Accordingly, a constant-gain phase shifter is provided, comprising a first tank circuit with a first node to accept an input signal, a first inductor connected between the first node and a reference voltage, and a first capacitor connected in parallel with the first inductor between the first node and the reference voltage. The first tank circuit modifies the phase and the insertion loss associated with the input signal.

A variable gain circuit has an input connected to the first node, an input to accept a control signal, and an output to supply a gain-modified signal. A second tank circuit comprises a second node connected to the variable insertion loss circuit output to supply a constant-gain phase-shifted signal. The second tank circuit comprises a second inductor connected between the second node and the reference voltage, and a second capacitor connected in parallel with the second inductor between the first node and the reference voltage. The second tank circuit modifies the phase and insertion loss associated with the gain-modified signal.

As noted above, both the first and second tank circuits have a minimum insertion loss (ILmin) at their resonant frequencies ($f_0$) and a +/−45 degree phase shift at frequencies associated with a 3 dB insertion loss (ILmin1−3 dB). Also as noted above, the first and second capacitors can be variable capacitance capacitors, such as FE capacitors.

In one aspect, the phase shifter further comprises a phase splitter having an input connected to the second node to accept the constant-gain phase-shifted signal, a first output to supply a first phase signal, and a second output to supply a second phase signal offset from the first phase signal by 180 degrees. Passive and active phase splitters are described.

Additional details of the above-described phase shifter circuit, an antenna array using the above-described phase shifter, and a method for maintaining constant gain, while phase-shifting a signal, are provided below.

DETAILED DESCRIPTION

Figure 1:
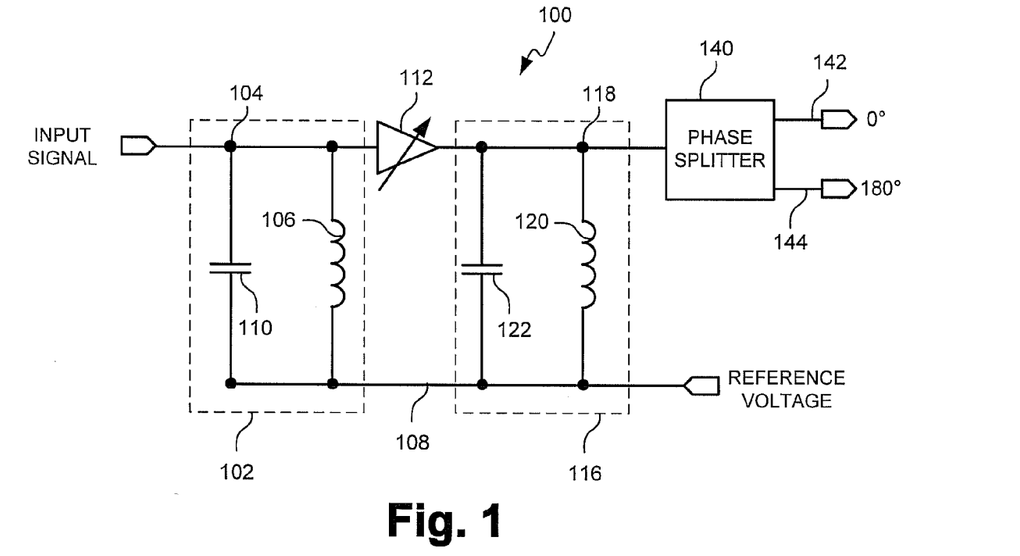
FIG. 1 is a schematic block diagram of a constant-gain phase shifter.

FIG. 1 is a schematic block diagram of a constant-gain phase shifter. The phase shifter 100 comprises a first tank circuit 102, which includes a first node 104 to accept an input signal, and a first inductor 106 connected between the first node 104 and a reference voltage 108. The reference voltage 108 can be either an AC or DC ground. The first tank circuit 102 also includes a first capacitor 110 connected in parallel with the first inductor 106 between the first node 104 and the reference voltage 108. The first tank circuit 102 modifies the phase and the insertion loss associated with the input signal.

A variable gain circuit 112 has as input connected to the first node 104, and an output to supply a gain-modified signal at a second node 118. Typically, the variable gain circuit is a variable gain amplifier, but alternately is could be a variable loss attenuator (not shown). A second tank circuit 116 comprises second node 118 connected to the output of the variable gain circuit 112, to supply a constant-gain phase-shifted signal. A second inductor 120 is connected between the second node 118 and the reference voltage 108. A second capacitor 122 is connected in parallel with the second inductor 120 between the second node 118 and the reference voltage 108. The second tank circuit modifies the phase and insertion loss associated with the gain-modified signal.

The first inductor 106 and the second inductor 120 may be lumped element, microstrip, or volumetric resonators. The first capacitor 110 and second capacitor 122 are lumped element components. Using these types of components, the first tank circuit 102 and second tank circuit 116 can accept input signals all the way from audio, to frequencies of greater than 2 gigahertz.

Figure 2:
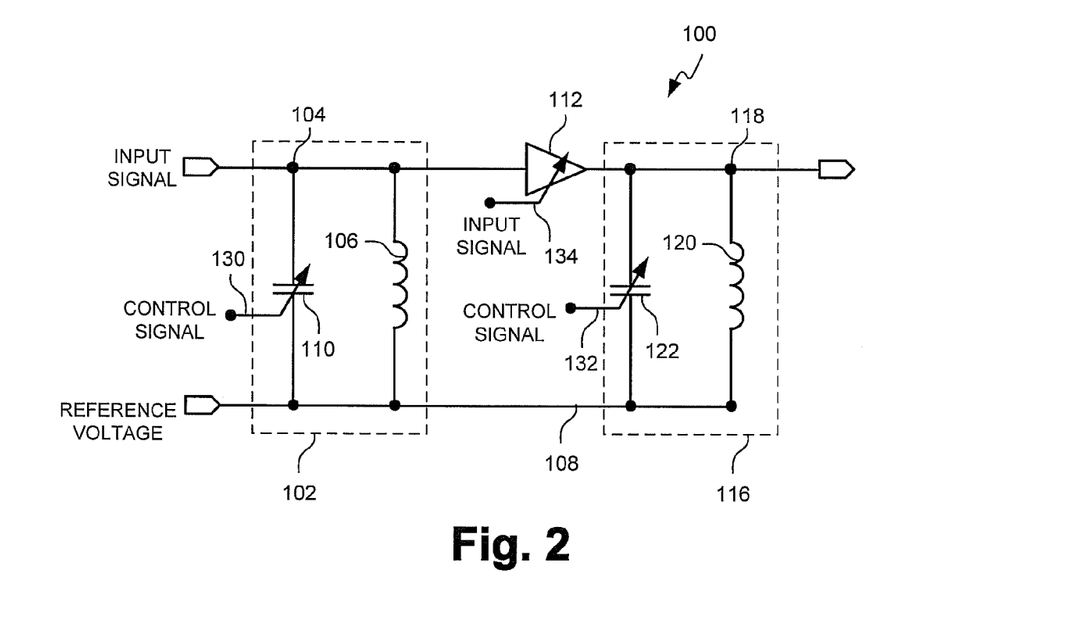
FIG. 2 is a schematic diagram illustrating details of the phase shifter circuit of FIG. 1.

FIG. 2 is a schematic diagram illustrating details of the phase shifter circuit 100 of FIG. 1. The phase shifter 100 of FIG. 2 comprises a first tank circuit 102, which includes a first node 104 to accept an input signal, and a first inductor 106 connected between the first node 104 and a reference voltage 108. A second tank circuit 116, comprises a second node 118 connected to the output of the variable gain circuit 112. A second inductor 120 is connected between the second node 118 and the reference voltage 108. Typically, the first capacitor 110 and the second capacitor 122 are variable capacitance capacitors. Tuning can be achieved using varactor diodes, mechanically tuned (parallel plate) capacitors, or microelectromechanical switch (MEMS) technology to switch between finite value capacitors. However, in one aspect FE capacitors are used as the first capacitor 110 and the second capacitor 122. That is, the first capacitor 110 and the second capacitors 122 each comprise a dielectric formed from a ferroelectric material with a variable dielectric constant responsive to a phase control signal. Since $f_0 = 1/(2\pi (L*C)^{1/2})$, a capacitance change of 2:1, means that the resonant frequency of each tank circuit can be changed more than 40%.

Thus, the first capacitor 110 has an input to accept a phase control signal on line 130. The first tank circuit 102 modifies its resonant frequency in response to the phase control signal, to supply a modified input signal. The modified input signal is shifted in phase a first number of degrees and has a first insertion loss, respective to the input signal.

Likewise, the second capacitor 122 has an input to accept a phase control signal on line 132. The second tank circuit 116 modifies its resonant frequency in response to the phase control signal on line 132. The second tank circuit 116 supplies an output signal shifted a second number of degrees, and with a second insertion loss, respective to the gain-modified signal from the variable gain circuit 112. The variable gain circuit 112 accepts a control signal on line 134, and varies the gain of the gain-modified signal (the amplifier output), to compensate for first insertion loss associated with the first tank circuit 102, as well as the second insertion loss associated with the second tank circuit 116.

Returning to FIG. 1, in one aspect the phase shifter circuit 100 further comprises a phase splitter 140. The phase splitter 140 has an input connected to the second node 118 to accept the constant-gain phase-shifted signal, a first output on line 142 to supply a first phase signal, and a second output on line 144 to supply a second phase signal offset from the first phase signal by 180 degrees.

Figure 3:
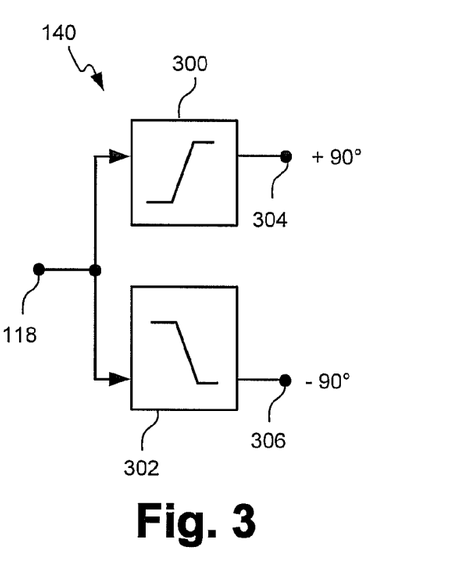
FIG. 3 is a schematic diagram illustrating a first variation of the phase splitter of FIG. 1.

FIG. 3 is a schematic diagram illustrating a first variation of the phase splitter 140 of FIG. 1. In this variation the phase shifter 140 comprises a second-order highpass filter 300 and a second-order lowpass filter 302. Each filter 300/302 has an input connected to the second node 118. The highpass filter 300 has an output on line 304 to supply the first phase signal, offset from the constant-gain phase-shifted signal (at second node 118) by +90 degrees. The lowpass filter 302 has an output on line 306 to supply the second phase signal, offset from the constant-gain phase-shifted signal by −90 degrees. By controlling the phase in the first tank circuit 102 and second tank circuit 116, a zero-to-180 degree phase shift can be obtained. By switching between outputs 304 and 306 (using a switch not shown), an additional 180 degrees of phase change can be obtained, if desired. By controlling both the phase splitter and the tank circuits, a phase shift within the range of 0 to 360 degrees can be obtained.

In another aspect, the gain of the variable gain circuit 112 can be controlled to compensate for any additional losses that may occur through the above-described phase splitter 140.

Figure 4:
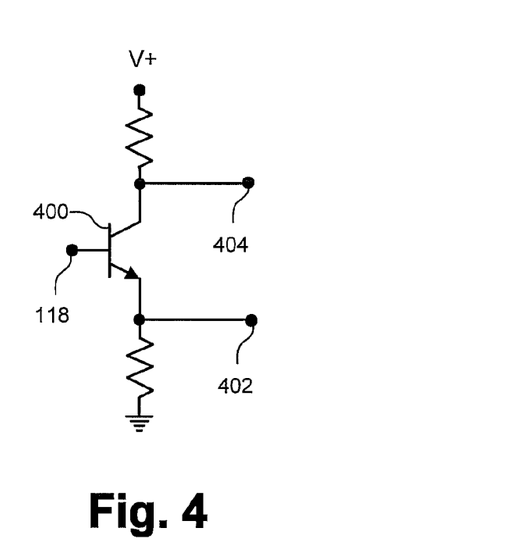
FIG. 4 is a schematic diagram illustrating a second variation of the phase splitter of FIG. 1.

FIG. 4 is a schematic diagram illustrating a second variation of the phase splitter 140 of FIG. 1. In this aspect the phase splitter 140 is a common-emitter configured bipolar transistor 400 with a base connected to the second node 118, and an emitter coupled to voltage V+ and connected to a first output 402 to supply the first phase signal, offset from the constant-gain phase-shifted signal (at second node 118) by zero degrees. The collector-connected second output on line 404 supplies the second phase signal, offset from the constant-gain phase-shifted signal by 180 degrees. One skilled in the art having the benefit of this disclosure would be able to design other transistor amplifier circuitry to perform the same functions.

Figure 5A:
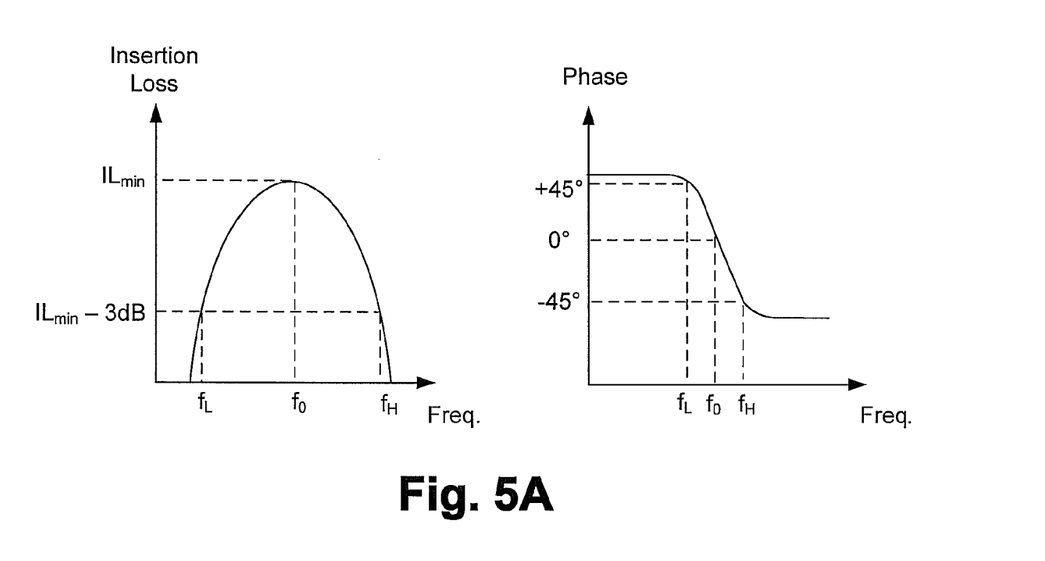
FIGS. 5A, 5B and 5C represent graphs of the signal phase and insertion loss through the tank circuits.
Figure 5B:
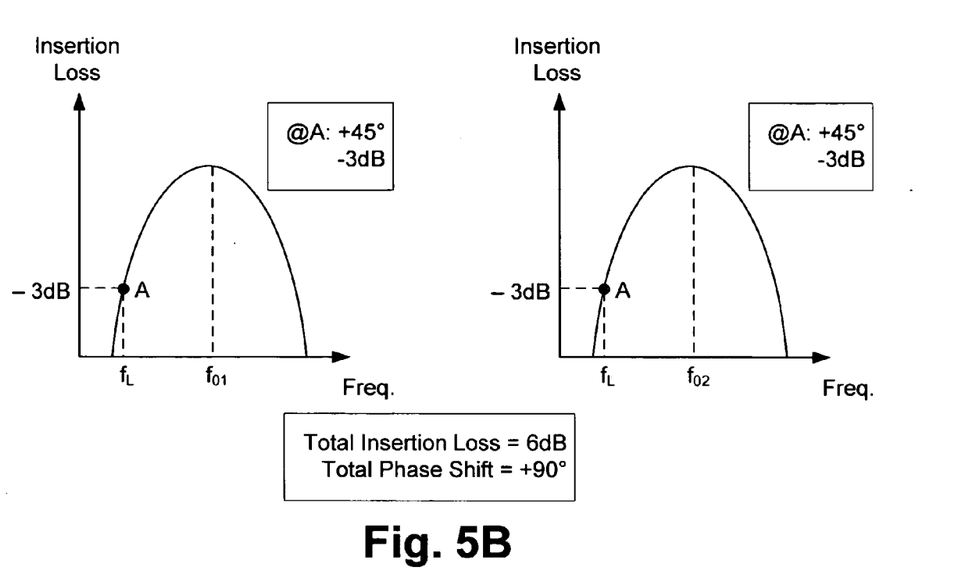
Figure 5C:
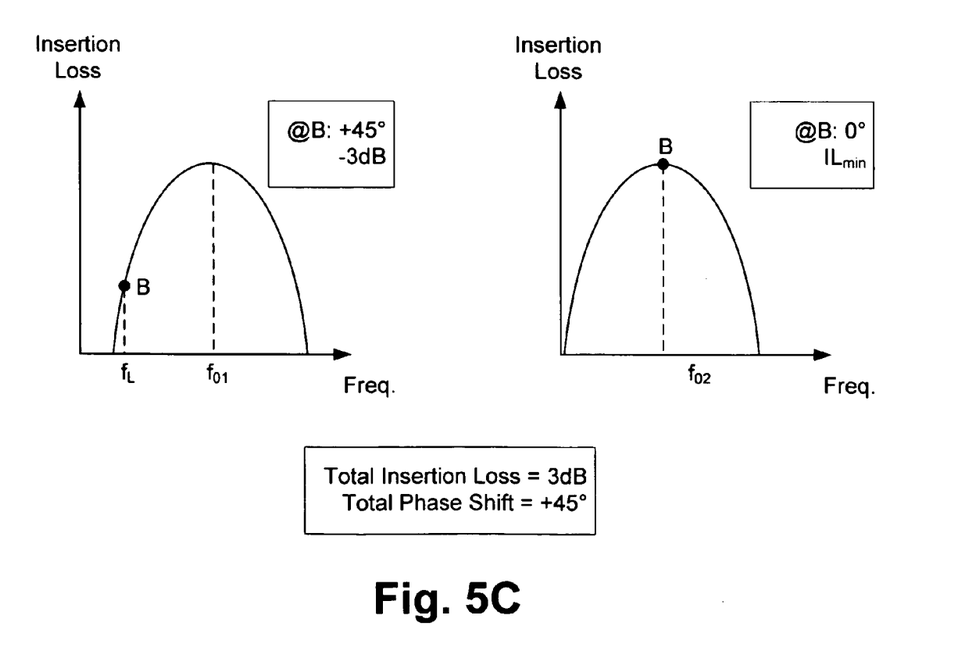

FIGS. 5A, 5B and 5C represent graphs of the signal phase and insertion loss through the tank circuits. FIG. 5A represents graphs of the general relationship between the phase and insertion loss of a single tank circuit. Considering FIGS. 1 and 5A, the first tank circuit 102 has a minimum insertion loss, ILmin, at a first resonant frequency, $f_0$, and a +/−45 degree phase shift at (the two) frequencies, $F_L$ and $F_H$, associated with a 3 dB insertion loss, ILmin−3 dB. Likewise, the second tank circuit 116 has a minimum insertion loss, ILmin, at a second resonant frequency, $f_0$, and a +/−45 degree phase shift at frequencies associated with a 3 dB insertion loss, ILmin−3 dB.

FIG. 5B depicts a first set of exemplary phase and attenuation measurements associated with the first and second tank circuits. It should be appreciated that the signal phase shift is obtained by tuning the tank circuits. Knowing the frequency of the input signal, the resonant frequency of a tank circuit is tuned to obtain the desired phase. Thus, if the two tank circuits are tuned to the same frequency (f01=f02), the second tank circuit can supply a constant-gain signal (at node 118) offset as much as +/−90 degrees from the input signal. For example, in scenario A, a +90 degree phase shift occurs if the input signal is tuned to be at the lower 3 dB point at $F_L$ of each tank circuit. In this case, the variable gain circuit 112 must compensate for a 6 dB insertion loss (plus the minimum IL of each tank).

FIG. 5C depicts a second exemplary phase and attenuation measurements associated with the first and second tank circuits. In scenario B, the second tank circuit is tuned so that f02 coincides with lower 3 dB point at $F_L$ of the first tank circuit. Then, the overall phase shift is 45 degrees, and the overall insertion loss is 3 dB (plus the minimum IL of each tank circuit).

Figure 6:
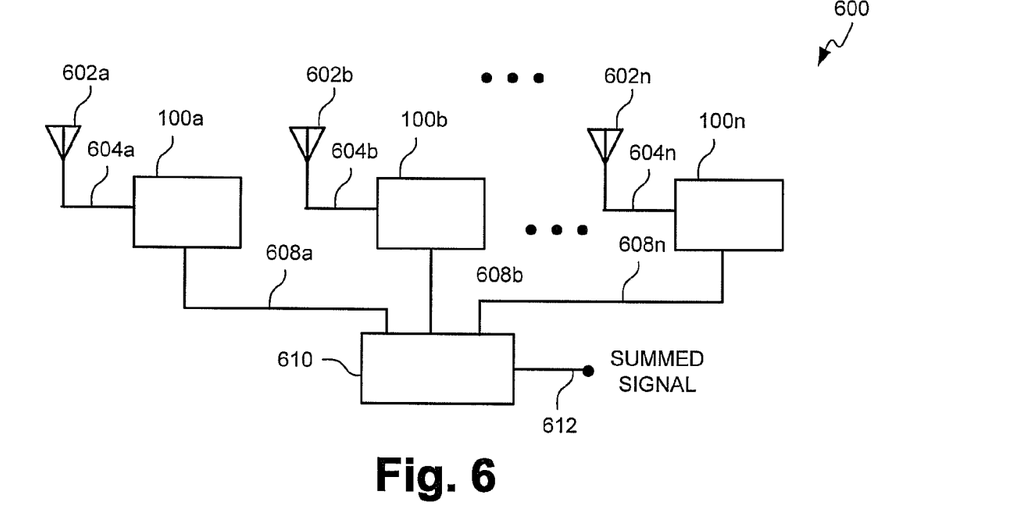
FIG. 6 is a schematic block diagram depicting an antenna array system.

FIG. 6 is a schematic block diagram depicting an antenna array system. The system 600 comprises a plurality of antennas 602a, 602b, through 602n, but the system is not limited to any particular number of antennas. Each antenna has an antenna port, 604a, 604b, through 604n, respectively. The system 600 comprises a plurality of constant-gain phase-shifter (CGPS) circuits 100, one for each antenna. Shown are phase shifter 100a, associated with antenna 602a, phase shifter 100b, associated with antenna 602b, and phase shifter 100n, associated with antenna 602n. Each circuit 100a, 100b through 100n has an input (604a, 604b, through 604n), respectively, connected to the antenna port of a corresponding antenna, and an output, respectively, 608a, 608b, through 608n.

A summing circuit 610 has inputs connected to each constant gain phase-shifter circuit output 608a, 608b, and 608n. The summing circuit 610 has an output on line 612 to supply a summed signal that is a combination of all the summing circuit inputs. A variety of conventional summing circuit and antenna designs may be used to enable the system 600. The primary novelty of the system 600 is in the phase shifter circuit 100. Details of the constant-gain phase shifter 100 are provided in the explanations of FIGS. 1, 2, and 5A–5C. In other aspects, the phase shifter 100 includes a phase splitter, as described in FIGS. 3 and 4.

The system 600 does not require an additional amplification between the phase shifters and the summing circuit to compensate for insertion loss through the phase shifters. In one aspect not shown, the system 600 may further include measurement circuitry between each phase shifter and the summing circuit, to fine-tune or calibrate each phase shifter 100. It should also be noted that the antenna array system 600 may receive signals, transmit signals, or perform both functions.

Functional Description

Figure 7A:
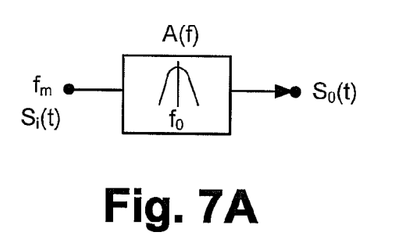
FIGS. 7A, 7B and 7C are diagrams representing the phase shifter circuit functions as mathematical expressions.
Figure 7B:
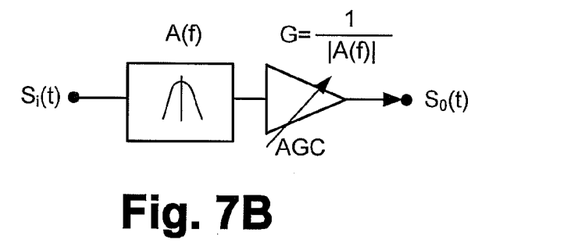
Figure 7C:
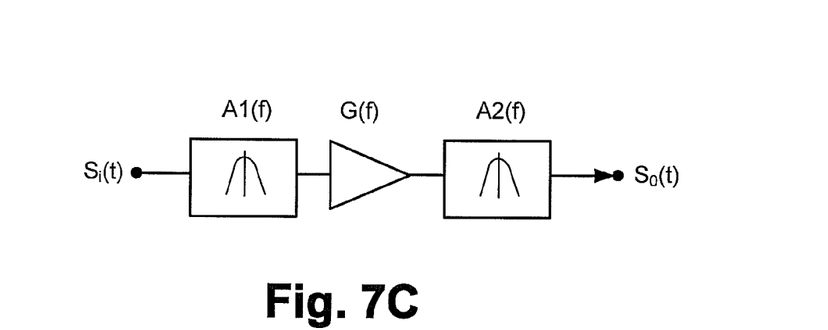

FIGS. 7A, 7B and 7C are diagrams representing the phase shifter circuit functions as mathematical expressions having an input sinusoidal signal Si(t) and an output sinusoidal signal So(t). In FIG. 7A, the input to the tank circuit can be compared to the output as follows:

$$Si(t)A(f)=So(t)$$

The input signal frequency ($f_m$) may, or may not be equal to the tank circuit resonant frequency ($f_0$). It is assumed that Si(t) is a sinusoidal signal, and narrowband with respect to the filter bandwidth ($f_H$–$f_L$). If $$Si(t) = \operatorname{Sin}(\omega t), \text{ then}$$

$$So(t) = A(f)Si(\omega t + 0)$$

$$\approx A \, Si(t)e^{j\theta}$$

At a frequency (f), between $f_H$ and $f_L$ $|A(f)|<1;$ and $(\theta)\leq 45°$.

In FIG. 7B, the insertion loss associated with the tank circuit, A(f), can be compensated using the variable gain circuit, AGC, having a gain, G, as follows:

$$G=1/|A(f)|.$$

FIG. 7C represents the overall gain of both tank circuits, with the variable gain circuit, wherein the output sinusoidal signal So(t) is a function of the gain G(f) times the insertion losses, A1(f) and A2(f), of two tank circuits according to the following equation.

$$So(t)=G(f)*A1(f)*A2(f)*\sin(\omega t+\theta t)$$

To minimize the gain required through the variable gain circuit, and to minimize receiver noise figure, the tunable capacitor used within the tank circuits should be of sufficiently low loss. The total loss of a capacitor, Lt, whether tunable or not, is given by a ratio of its dissipated to stored energy, where the energy is stored in the electric field and dissipated in resistance, i.e., Lt=(dissipated energy)/(stored energy). The inverse of this loss is the quality factor, Q. For a capacitor, Lt may be given by the quantity ($\omega$*Rs*C), where $\omega$ is the frequency in radians, Rs is the total series resistance of the capacitor, and C is the capacitance.

The importance of determining the total loss given by an FE capacitor in a resonant circuit can be seen from the following equations:

$$Lc=1/Qc \text{ and } 1/Qt=1/Qc+1/Qu, \text{ where,}$$

Lc=the loss of the capacitor;
Qt=the total Q of the FE capacitor and the resonator or inductor combined;
Qc=the Q of the capacitor; and
Qu=the Q of the unloaded resonator or alternatively, the Q of an inductor used to create a parallel resonant circuit.

As Qc increases, it will affect the Qt less. If Qc is infinite, it has no affect on Qt. For practical purposes, this is also true if Qc is approximately 10*Qu. The converse is true too. As Qu becomes higher relative to Qc, Qu has less effect on Qt. In either case, the highest practical Qc is desired.

In the PCS band, for a 1.0 pF tunable capacitor to have a Qc=250 at 2.0 GHz, Rs must be 0.32 Ω (ohms). To minimize loss (obtain a low Rs), an accounting of all loss mechanisms is desirable.

For FE devices, the total loss is governed by summing each source contribution as follows:

$$Lt=L_{geom}+L_{attach}+L_{metal}+L_{sub}+L_{rad}+L_{meas}+L_{FE};$$

where $L_{geom}$ is derived from the topology of the capacitor,
$L_{attach}$ is loss due to device attachment,
$L_{metal}$ is the total metal loss,
$L_{sub}$ is the base substrate loss (if present),
$L_{rad}$ is the radiation loss, both desired and undesired,
$L_{meas}$ is the total loss arising from measurement errors, and
$L_{FE}$ is the FE loss tangent. A more detailed treatment of this subject can be found in U.S. Pat. No. 6,639,491, which is incorporated herein by reference.

FE film properties and fabrication play a significant role in overall capacitor loss. Many techniques exist to mitigate and minimize FE film loss. One feature of FE films is that FE film loss and tunability usually have an inverse relationship. That is, they usually must be traded off against each other. The greater the FE dielectric constant tuning range, the greater the FE loss in most cases.

Thus, even though FE materials can achieve a dielectric constant tuning range of about 3 to 1, less tuning may be acceptable for a given filter application. In that case, less tuning would be chosen, with the benefit of less loss. For example, in the US PCS CDMA band, the tuning requirement in the transmit band is from 1850 MHz to 1910 MHz, or about 4%. Even if the KPCS and USPCS is combined (1750 to 1910 MHz, or about 8%), the FE material can have significantly less tunability than 3 to 1.

For example, an FE gap capacitor with 0.6 pF at 0V DC bias, needs to tune 33%, (from 0.6 pF down to 0.4 pF), to tune over the PCS transmit band. The actual tuning range depends on the filter topology and the band over which the BPF must be tuned. The required tuning voltage to provide the 33% tuning in this example depends on the FE capacitor geometry, including FE film thickness, and the FE film characteristics. The effect of dielectric constant tunability on frequency tunability is determined by the filter topology.

With respect to $L_{geom}$ for a gap capacitor, the major contributions to loss are the four corners formed by the gap. These losses can be reduced by rounding the corners. In comparison to gap and interdigital capacitors, an overlay capacitor has the lowest $L_{geom}$. An overlay capacitor is an example of a parallel plate geometry where the plate dimensions (length and width) are much greater than the plate separation. Given such a geometry, most of the electric field between the plates is uniform except for fringing along the edges. The fringing effect can be reduced significantly by the use of a guard band. Thus, the geometric loss from a parallel plate capacitor is quite low. In addition, parallel plate geometries can provide high capacitances along with high tuning from small control voltage swings.

Figure 8:
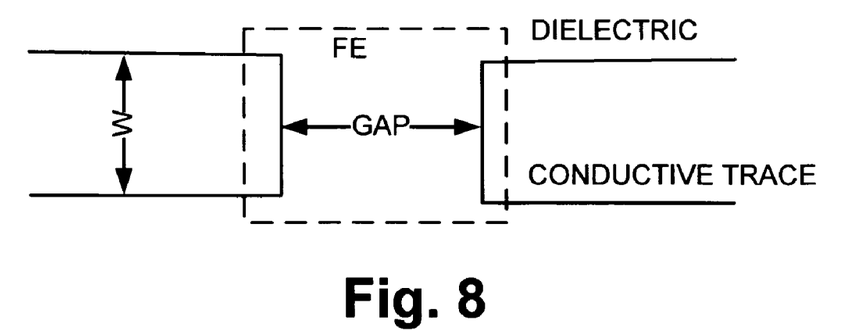
FIG. 8 is a plan view of a distributed element gap capacitor.

FIG. 8 is a plan view of a distributed element gap capacitor which, in one embodiment, is formed on a dielectric and has two conductive traces seperated by a gap. A ferroelectric (FE) material is placed in a narrow region around the gap. Compared to an interdigital capacitor (IDC), the gap capacitor has a better Q, but lower capacitance per unit cross section (W). The IDC's capacitance is greater due to the use of a number of fingers per unit cross section. For many communication filter applications, however, a large capacitance ($C \geq 4.0$ pF) is not needed. Thus, a gap capacitor often can provide adequate capacitance. The inherently high value of κ (dielectric constant) of most FE films helps provide relatively high capacitance per unit cross-section, W, compared to a conventional gap capacitor.

Figure 9:
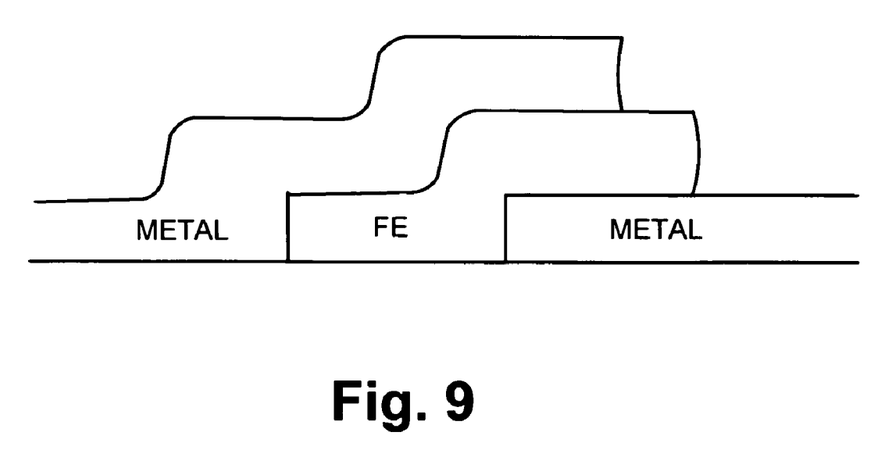
FIG. 9 is a cross-sectional view of an overlay capacitor.

FIG. 9 is a cross-sectional view of an overlay capacitor in which the two conductive metal layers overlap. A ferroelectric (FE) layer is formed between the overlap area. In comparison to gap and interdigital capacitors, an overlay capacitor has the lowest $L_{geom}$. An overlay capacitor is an example of a parallel plate geometry where the plate dimensions (length and width) are much greater than the plate separation. Given such a geometry, most of the electric field between the plates is uniform except for fringing along the edges. The fringing effect can be reduced significantly by the use of a guard band. Thus, the geometric loss from a parallel plate capacitor is quite low. In addition, parallel plate geometries can provide high capacitances along with high tuning from small control voltage swings.

Figure 10:
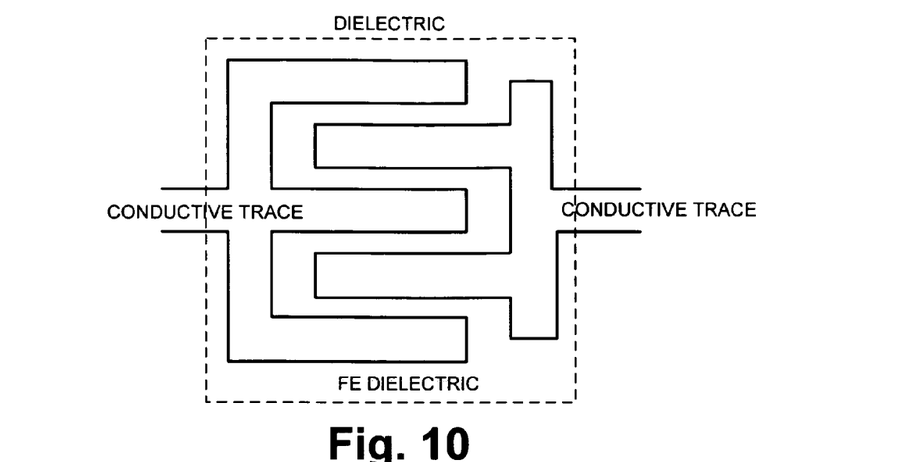
FIG. 10 is a plan view of an interdigital (IDC) capacitor.

FIG. 10 is a plan view of an interdigital (IDC) capacitor which comprises two conductive traces with interwoven fingers separated by a gap. In one embodiment as illustrated, a ferroelectric (FE) material is deposited between a dielectric and the conductive traces in a narrow region around the gap. For a given cross-sectional area, an IDC can provide a higher capacitance than a gap capacitor. Loss increases as the gap spacing decreases. Similarly, loss increases as finger width decreases. The finger length also affects loss with loss increasing as finger length increases; especially in a microstrip realization of an IDC as the odd mode loss dominates in such a structure. In addition, loss increases as the number of fingers increases, due to loss introduced from the additional sharp corners. Note that an increase in the number of fingers typically increases the capacitance of an IDC.

In general, a gap capacitor is easiest to fabricate. An IDC is next easiest, and an overlay capacitor is hardest of these three. Compared to an IDC, the gap capacitor has a better Q, but lower capacitance per unit cross-section. The IDC's capacitance is greater due to the use of a number of fingers per unit cross section. For many communication filter applications, however, a large capacitance (C greater than 4.0 pF) is not needed. Thus, a gap capacitor often can provide adequate capacitance. The inherently high value of dielectric constant for most FE films helps provide relatively high capacitance per unit cross section, compared to a conventional gap capacitor.

The highest possible Qu for a resonator should be used to minimize IL, given size and height constraints. To define Qu, a tank circuit can defined, which is formed by a resonator shunt-connected with a capacitor. The resonator may be grounded quarter wavelength resonator, but the length of the resonator can be selected to obtain a particular inductance value. Volumetric resonators (e.g., coaxial, stripline, and monoblock) are often preferred, as they provide the highest Qu and smallest area and height at a minimal price, as compared to planar, i.e., microstrip, alternatives. For high volume applications, such as wireless handsets, transverse electromagnetic (TEM) wave volumetric resonators may be preferred. Such volumetric resonators can be ceramic loaded coaxial resonators, slabline (monoblock) or stripline, to name the three most common realizations.

Figure 11:
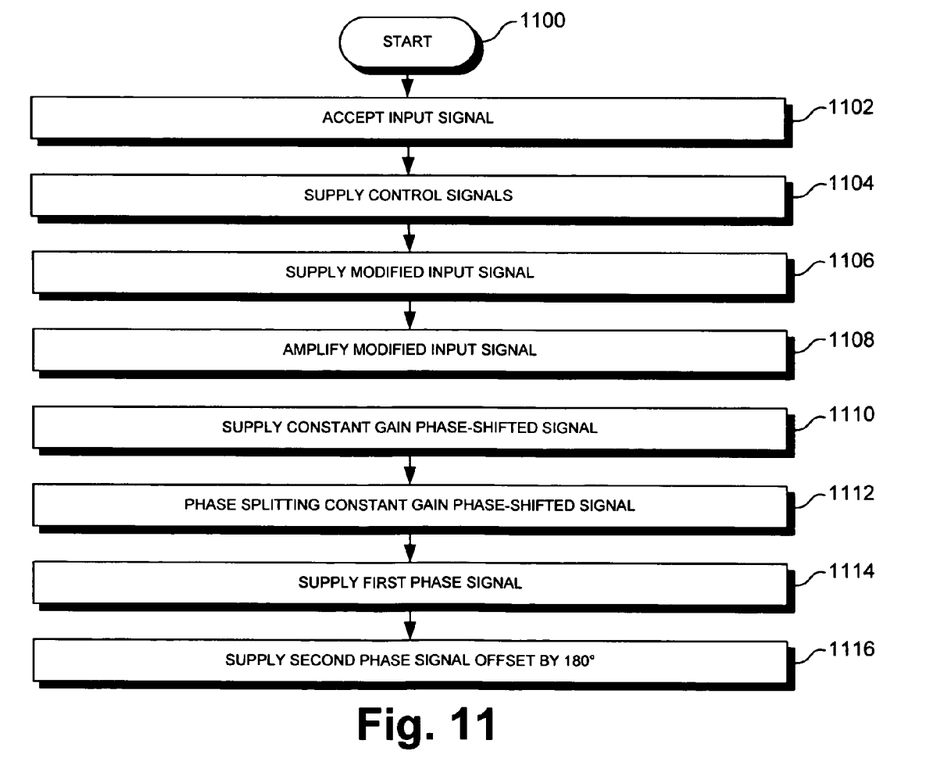
FIG. 11 is a flowchart illustrating a method for maintaining constant gain, while phase-shifting a signal.

FIG. 11 is a flowchart illustrating a method for maintaining constant gain, while phase-shifting a signal. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. Details of the method may be understood in the contest of FIGS. 1 through 10. The method starts at Step 1100.

Step 1102 accepts an input signal. Step 1106 supplies a modified input signal, modified a first number of degrees and with a first insertion loss, respective to the input signal. Step 1108 amplifies the modified input signal to supply a gain-modified signal. Step 1110 supplies a constant-gain phase-shifted signal, modified a second number of degrees and with a second insertion loss, respective to the gain-modified signal.

In one aspect, modifying the input signal a first number of degrees respective to the input signal (Step 1106) comprises the first number of degrees being in the range of +45 to −45 degrees. Likewise, in Step 1110 the second number of degrees is in the range of +45 to −45 degrees.

In another aspect, Step 1106 modifies the input signal with a first tank circuit resonant at approximately the frequency of the input signal, and Step 1110 modifies the gain-modified signal with a second tank circuit resonant at approximately the frequency of the input signal.

In one aspect, Step 1106 modifies the input signal by varying the capacitance of a first capacitor connected in parallel with a first inductor. Likewise, Step 1110 modifies the gain-modified signal by varying the capacitance of a second capacitor connected in parallel with a second inductor.

In another aspect an additional step, Step 1104 supplies first and second control signals. Then, Step 1106 varies the capacitance of the first capacitor by selecting the dielectric constant value of a ferroelectric (FE) dielectric capacitor in response to the first control signal. Step 1110 varies the capacitance of the second capacitor by selecting the dielectric constant value of an FE dielectric capacitor in response to the second control signal.

In one aspect, Step 1112 phase splits the constant-gain phase-shifted signal. Step 1114 supplies a first phase signal. Step 1116 supplies a second phase signal, offset from the first phase signal by 180 degrees.

In one variation, Step 1114 highpass filters to supply the first phase signal offset from the constant-gain phase-shifted signal by +90 degrees. Supplying a second phase signal, in Step 1116, comprises lowpass filtering to supply the second phase signal offset from the constant-gain phase-shifted signal by −90 degrees. Typically, second-order highpass and lowpass filters are used to perform steps 1114 and 1116, respectively.

In a second variation, Step 1114 uses the emitter output of an emitter-coupled transistor to supply the first phase signal offset from the constant-gain phase-shifted signal by zero degrees. Step 1116 uses the collector output of the emitter-coupled transistor to supply the second phase signal offset from the constant-gain phase-shifted signal by 180 degrees.

A constant-gain phase shifter circuit, an antenna array using the constant-gain phase shifter, and a constant-gain phase shifting method have been provided. Specific filter topologies and designs have been used as examples to illustrate the invention. However, the invention is not limited to merely these examples. Likewise, although an antenna array is shown as an exemplary circuit application, many other applications are possible. Other variations and embodiments will occur to those skilled in the art having the benefit of this disclosure.

What is claimed is:

1. A constant-gain phase shifter comprising:
   a first tank circuit comprising a first node to accept an input signal, a first inductor connected between the first node and a reference voltage, and a first capacitor connected in parallel with the first inductor between the first node and the reference voltage, the first tank circuit modifying the phase and the insertion loss associated with the input signal;
   a variable gain circuit having an input connected to the first node, and an output to supply a gain-modified signal; and
   a second tank circuit comprising a second node connected to the variable gain circuit output to supply a constant-gain phase-shifted signal, a second inductor connected between the second node and the reference voltage, and a second capacitor connected in parallel with the second inductor between the second node and the reference voltage, the second tank circuit modifying the phase and insertion loss associated with the gain-modified signal.

2. The phase shifter of claim 1 wherein the first tank circuit has a first minimum insertion loss (ILmin1) at a first resonant frequency ($f_{o1}$) and a +/−45 degree phase shift at frequencies associated with a 3 dB insertion loss (ILmin1−3 dB); and
   wherein the second tank circuit has a second minimum insertion loss (ILmin2) at a second resonant frequency ($f_{o2}$) and a +/−45 degree phase shift at frequencies associated with a 3 dB insertion loss (ILmin2−3 dB).

3. The phase shifter of claim 2 wherein the first and second capacitors are variable capacitance capacitors.

4. The phase shifter of claim 3 wherein the first capacitor has an input to accept a phase control signal, the first tank circuit modifying its resonant frequency in response to the phase control signal, the first tank circuit supplying a modified input signal shifted in phase a first number of degrees and with a first insertion loss relative to the input signal;
   wherein the second capacitor has an input to accept a second phase control signal, the second tank circuit modifying its resonant frequency in response to the second phase control signal, the second tank circuit supplying an output signal shifted a second number of degrees and with a second insertion loss relative to the gain-modified signal; and
   wherein the variable gain circuit accepts a control signal, and varies the gain of the gain-modified signal, to compensate for the first and second insertion losses associated with the first and second tank circuits, respectively.

5. The phase shifter of claim 4 wherein the first and second capacitors each comprise a ferroelectric material with a variable dielectric constant responsive to the respective phase control signal.

6. The phase shifter of claim 2 wherein $f_{o1}=f_{o2}$; and wherein the second tank circuit supplies a constant-gain signal offset as much as +/−90 degrees from the input signal.

7. The phase shifter of claim 1 further comprising:
   a phase splitter having an input connected to the second node to accept the constant-gain phase-shifted signal, a first output to supply a first phase signal, and a second output to supply a second phase signal offset from the first phase signal by 180 degrees.

8. The phase shifter of claim 7 wherein the phase splitter comprises a second-order highpass filter and a second-order lowpass filter, each having an input connected to the second node, the highpass filter having an output to supply the first phase signal that is offset from the constant-gain phase-shifted signal by +90 degrees, and the lowpass filter having an output to supply the second phase signal that is offset from the constant-gain phase-shifted signal by −90 degrees.

9. The phase shifter of claim 7 wherein the phase splitter is a common-emitter configured bipolar transistor with a base connected to the second node, an emitter-connected first output to supply the first phase signal that is offset from the constant-gain phase-shifted signal by zero degrees, and a collector-connected second output to supply the second phase signal that is offset from the constant-gain phase-shifted signal by 180 degrees.

10. The phase shifter of claim 1 wherein the first and second inductors are components selected from the group comprising lumped element, microstrip, and volumetric resonator components; and
    wherein the first and second capacitors are lumped element components.

11. The phase shifter of claim 1 wherein the first tank circuit accepts the input signal having a frequency in the range between audio and approximately 2 gigahertz.

12. The phase shifter of claim 1 wherein the variable gain circuit is a variable gain amplifier.

13. An antenna array system comprising:
    a plurality of antennas, each antenna having an antenna port;
    a plurality of constant-gain phase-shifter circuits, each constant-gain phase-shifter circuit of the plurality of constant-gain phase-shifter circuits having an input connected to the antenna port of a corresponding antenna of the plurality of antennas, and an output;
    a summing circuit having inputs connected to corresponding outputs of each constant gain phase-shifter circuit and a summing circuit output to supply a summed signal that is a combination of all the summing circuit inputs; and
    wherein each constant-gain phase-shifter circuit further comprises:
    a first tank circuit comprising a first node to accept an input signal from an the corresponding antenna port, a first inductor connected between the first node and a reference voltage, and a first capacitor connected in parallel with the first inductor between the first node and the reference voltage, the first tank circuit modifying a phase and an insertion loss associated with the input signal;

a variable gain circuit having a gain circuit input connected to the first node, a control input to accept a control signal, and a gain circuit output to supply a gain-modified signal; and a second tank circuit comprising a second node connected to the gain circuit output to supply a constant-gain phase-shifted signal to the corresponding input of summing circuit, a second inductor connected between the second node and the reference voltage, and a second capacitor connected in parallel with the second inductor between the first node and the reference voltage, the second tank circuit modifying the phase and insertion loss associated with the gain-modified signal.

14. The system of claim 13 wherein each constant-gain phase-shifter circuit further comprises:

a phase splitter having an input connected to the second node to accept the constant-gain phase-shifted signal, a first output to supply a first phase signal, and a second output to supply a second phase signal offset from the first phase signal by 180 degrees.

15. A method for maintaining constant gain while phase-shifting a signal, the method comprising:

accepting an input signal;

modifying a modified input signal a first number of degrees, the modified input signal having a first insertion loss;

amplifying the modified input signal to supply a gain-modified signal; and modifying the gain-modified signal a second number of degrees and with a second insertion loss to supply a constant-gain phase-shifted signal.

16. The method of claim 15 wherein modifying the input signal comprises modifying the input signal with a first tank circuit resonant at approximately the frequency of the input signal; and wherein modifying the gain-modified signal comprises modifying the gain-modified signal with a second tank circuit resonant at approximately the frequency of the input signal.

17. The method of claim 16 wherein modifying the input signal with the first tank circuit comprises varying a capacitance of a first capacitor connected in parallel with a first inductor; and wherein modifying the gain-modified signal with the second tank circuit comprises varying a capacitance of a second capacitor connected in parallel with a second inductor.

18. The method of claim 17 further comprising:

supplying a first control signal and a second control signal;

wherein varying the capacitance of the first capacitor comprises selecting a dielectric constant value of a first ferroelectric (FE) dielectric capacitor in response to the first control signal; and wherein varying the capacitance of the second capacitor comprises selecting a dielectric constant value of a second FE dielectric capacitor in response to the second control signal.

19. The method of claim 15 wherein the first number of degrees is in the range of +45 to −45 degrees; and wherein the second number of degrees is in the range of +45 to −45 degrees.

20. The method of claim 15 further comprising phase splitting the constant-gain phase-shifted signal into a first phase signal and a second phase signal, offset from the first phase signal by 180 degrees.

21. The method of claim 20 wherein supplying the first phase signal comprises highpass filtering to supply the first phase signal offset from the constant-gain phase-shifted signal by +90 degrees; and wherein supplying the second phase signal comprises lowpass filtering to supply the second phase signal offset from the constant-gain phase-shifted signal by −90 degrees.

22. The method of claim 20 wherein supplying the first phase signal comprises using the emitter output of an emitter-coupled transistor to supply the first phase signal offset from the constant-gain phase-shifted signal by zero degrees; and wherein supplying the second phase signal comprises using the collector output of the emitter-coupled transistor to supply the second phase signal offset from the constant-gain phase-shifted signal by 180 degrees.

* * * * *